United States Patent [19]

Hasegawa

[11] Patent Number: 4,939,788
[45] Date of Patent: Jul. 3, 1990

[54] CIRCUIT ARRANGEMENT FOR INDICATING ELECTRIC FIELD STRENGTH

[75] Inventor: Hiroki Hasegawa, Ota, Japan
[73] Assignee: Sanyo Electric Co., Ltd., Osaka, Japan
[21] Appl. No.: 308,268
[22] Filed: Feb. 9, 1989
[30] Foreign Application Priority Data Feb. 16, 1988 [JP] Japan ................... 63-33273

[51] Int. Cl.⁵ .............................. H04B 1/16
[52] U.S. Cl. ................... 455/241; 455/234; 455/250
[58] Field of Search ............ 455/234, 239, 240, 243, 455/246, 247, 249, 250, 315, 214, 336, 265, 134, 136; 381/7, 15

[56] References Cited

U.S. PATENT DOCUMENTS

| 3,673,499 | 6/1972 | Avins et al. | |
|---|---|---|---|
| 4,186,351 | 1/1980 | Brefini et al. | 455/234 |
| 4,619,002 | 10/1986 | Thro | 455/226 |
| 4,742,565 | 5/1988 | Iwahashi | 455/250 |

Primary Examiner—Robert L. Griffin
Assistant Examiner—Ralph E. Smith
Attorney, Agent, or Firm—Darby & Darby

[57] ABSTRACT

An FM receiver capable of generating a signal showing the electric field intensity of a received signal. More particularly, an FM receiver capable of generating a signal showing the electric field, wherein the dynamic range is expanded, and the linearity is improved. The enlargement of the dynamic range of the signal showing the electric field intensity may be effected, and also the linearity may be improved. Accordingly, the electric field intensity of the received signal may be correctly displayed by a display, etc. Especially, as the gain control is effected through the control of the operation current of the gain control amplification circuit in accordance with the gain control signal by the differential type of level detection circuit, an FM receiver suitable for IC may be provided.

6 Claims, 2 Drawing Sheets

ELECTRIC FIELD STRENGTH INDICATION

ELECTRIC FIELD STRENGTH INDICATION

CIRCUIT ARRANGEMENT FOR INDICATING ELECTRIC FIELD STRENGTH

BACKGROUND OF THE INVENTION

The present invention generally relates to an FM receiver which is capable of generating a signal showing the electric field strength of a received signal, and more particularly, to an FM receiver which is capable of generating a signal showing the electric field strength, wherein the dynamic range is expanded, and the linearity is improved.

Generally, the IF amplification stage of the FM receiver is composed of a multistage of differential type amplitude limit amplification circuit so as to improve an AM suppressing effect and a capture effect, with the gain of each stage being set from 6 dB to approximately 20 dB. Therefore, if a signal for showing the electric field strength from an optional stage of the IF amplification stage is taken out, the dynamic range will be narrowed from 6 dB to 20 dB or so.

As a method of enlarging the dynamic range of the signals for the electric field strength display, there is known such one as disclosed in Japanese Patent Publication Tokkosho No. 52-2561. As shown in FIG. 2, an FM RF signal received by an antenna 1 is amplified by an RF amplification circuit 2. Thereafter, the FM RF signal is mixed, by a mixer circuit 3, with an output signal of a local oscillation circuit 4, and is converted into an IF signal. The IF signal is amplified by the IF amplification circuits 5, 6 and 7 of three stages, and thereafter is FM-detected by an FM detection circuit 8. This method consists of this signal path, level detection circuits 9, 10 and 11 for level-detecting signals drawn from the IF amplification circuits 5, 6 and 7, and an addition circuit 12 for adding the output signals of the level detection circuits 9, 10 and 11, and is provided with an electric field strength signal generating circuit, for generating the output signals showing the electric field strength, at the output terminal of the addition circuit 12. In the case of the circuit of FIG. 2, the FM detection output signals may be obtained at a first output terminal 13. The electric field strength signal, whose dynamic range is enlarged, may be obtained at a second output terminal 14.

In the circuit of FIG. 2, as signals have to be obtained from a plurality of IF amplification circuits, a plurality of level detection circuits are required, thus resulting in complicated circuits. Undulation is caused in the electric field strength signal in the addition point so as to especially increase the number of the stages of the IF amplification circuit. When the electric field strength signal is so arranged as to be obtained for every other stage, a flat portion is caused in the addition point as shown in FIG. 4, thus making it impossible to effect the electric field strength display of good linearity. When the electric field strength signal is used as a stop signal of an automatic search, the stop signal detection sensitivity is likely to be influenced by the external circumstances if the stop sensitivity is set in the flat portion.

SUMMARY OF THE INVENTION

Accordingly, an essential object of the present invention is to provide an improved FM receiver, which comprises a gain control amplification circuit upon which the IF signals not subjected to amplitude limit are applied, a level detection circuit for detecting the level of the output signal of the gain control amplification circuit, and a control signal generating circuit for generating output signals for controlling the gain of the gain control amplification circuit in accordance with the output signal of the level detection circuit.

Another important object of the present invention is to provide an FM receiver of the above-described type which is provided with a gain control amplification circuit consisting of a differential type of level detection circuit, and a multistage amplification circuit, wherein an operation current changes in accordance with the output control signal of the control signal generating circuit and the gain changes in accordance with the change in the operating current.

In accomplishing these and other objects, according to one preferred embodiment of the present invention, there is provided an FM receiver which includes, in an FM receiver having a multistage of IF amplitude limit amplification circuit, a gain control amplification circuit upon which IF signals not subjected to the amplitude limit in the IF amplitude limit amplification circuit are applied, a level detection circuit for level-detecting the output signals of the gain control amplification circuit, a control signal generating circuit for generating the output signals for controlling the gain of the gain control amplification circuit in accordance with the output signal of the level detection circuit, and is characterized in that the output signals of the level detection circuit shows the electric field strength of the received signal. The IF signals not subjected to the amplitude limit are first amplified by the gain control amplification circuit. The amplified IF signals are level-detected by the level detection circuit and are introduced to the output terminal as electric field strength signals. Simultaneously, the output signal of the level detection circuit is applied upon the control signal generating circuit, which generates a control signal correspondingly. The control signal is applied upon the gain control amplification circuit to effect a gain control operation. The gain control is effected so that the gain of the gain control amplification circuit may be lowered as the electric field strength of the received signal becomes large, whereby the dynamic range of the electric field strength signal is enlarged.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
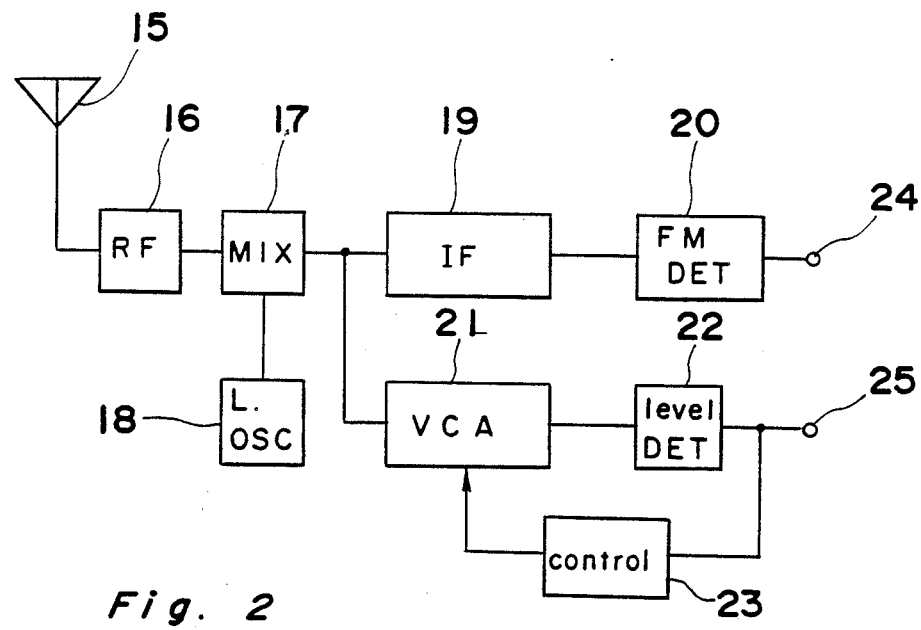
FIG. 1 is a circuit diagram showing one embodiment of the present invention.
Figure 2:
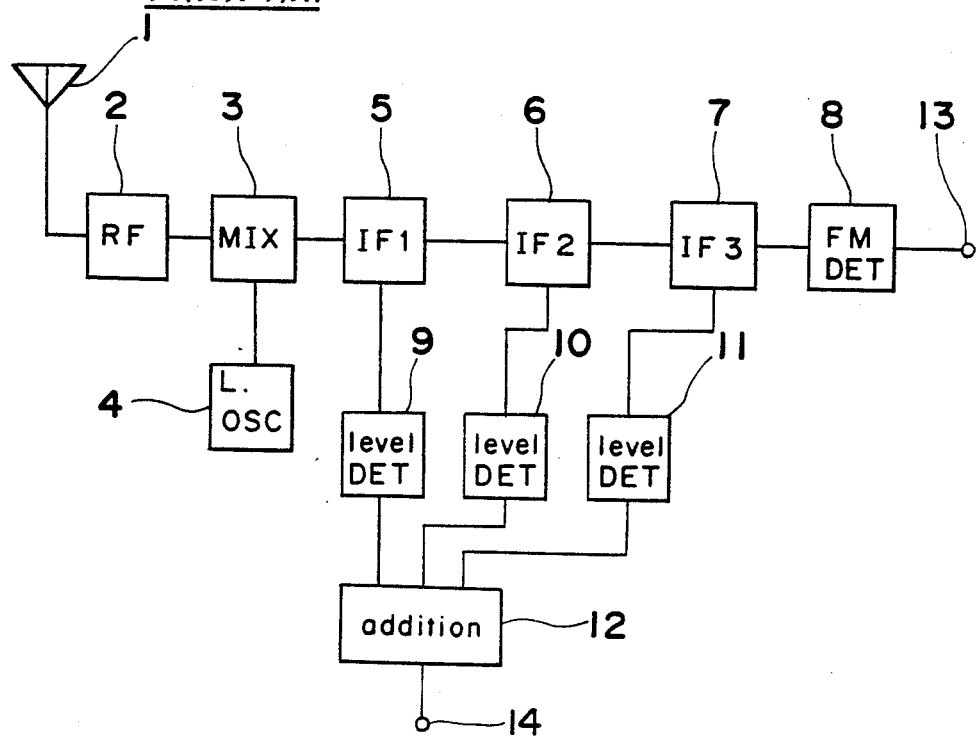
FIG. 2 is a circuit diagram showing the conventional FM receiver.

Before the description of the present invention proceeds, it is to be noted that like parts are designated by like reference numerals throughout the accompanying drawings.

Referring now to the drawings, there is shown in FIG. 1 a circuit diagram according to one preferred embodiment of the present invention, which includes an antenna 15 for receiving FMRF signals, an RF amplification circuit 16 for amplifying the FMRF signals, a mixer circuit for mixing the amplified RF signals with the output signals of the local oscillation circuit 18 so as to convert them into IF signals, an IF amplification circuit 19 for amplifying the IF signals for amplitude limit, an FM detection circuit 20 for FM-detecting the output IF signals of the IF amplification circuit 19, a gain control amplification circuit 21 for amplifying the output IF signals of the mixer circuit 17, a level detection circuit 22 for level-detecting the output signals of the gain control amplification circuit 21, and a control signal generating circuit 23 for generating the control signal so as to control the gain of the gain control amplification circuit 21 in accordance with the output signal of the level detection circuit 22.

The FMRF signal received by the antenna 15 is amplified by the RF amplification circuit 16, is converted into an IF signal by the mixer circuit 17, and is FM-detected by the FM detection circuit 20. Thus, the FM detection output signal is obtained at a first output terminal 24. Simultaneously, the IF signal not subjected to the amplitude limit is applied upon the gain control amplification circuit 21 for amplification thereby. The output signal of the gain control amplification circuit 21 is level-detected by the level detection circuit 22 so as to generate a signal showing the electric field strength of the received signal at a second output terminal 25. A signal showing the electric field strength to be obtained at the second output terminal 25 is applied upon the control signal generating circuit 23 so as to generate a control signal corresponding to a signal showing the electric field strength from the control generating circuit 23. The control signal is applied upon the gain control amplification circuit 21 so as to control the gain thereof.

If the electric field strength of the received signal is small, the level of the IF signal to be obtained from the mixer circuit 17 becomes small, and also, the output signal level of the gain control amplification circuit 21 becomes small. Therefore, the output signal of the level detection circuit 22 also becomes small, and no control signal is caused from the control signal generating circuit 23, with the gain of the gain control amplification circuit 21 becoming maximum. As the electric field strength of the received signal increases, the output signal level of the gain control amplification circuit 21 becomes large correspondingly, thus resulting in large output signal level of the level detection circuit 22. As the output signal level of the level detection circuit 22 becomes large, the control signal from the control signal generating circuit 23 is generated so as to reduce the gain of the gain control amplification circuit 21.

Figures 3, 4, 5:
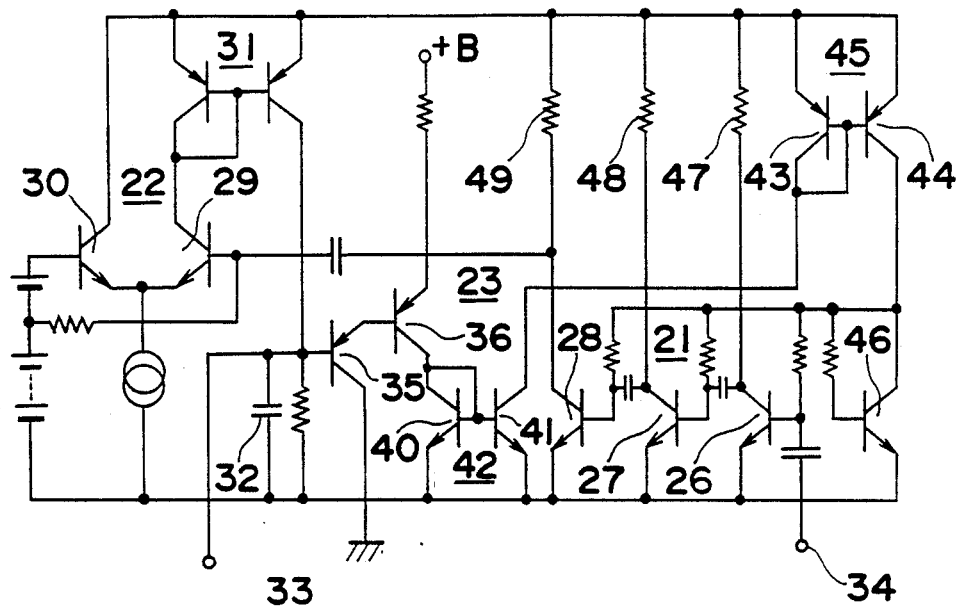
FIG. 3 is a circuit diagram showing a concrete circuit example of FIG. 1.
FIG. 4 is a characteristic chart for explaining the conventional FM receiver.
FIG. 5 is a characteristic chart for explaining the present invention.

With the use of the circuit of FIG. 1, the gain of the gain control amplification circuit 21 may be continuously varied in accordance with the electric field strength of the received signal, and the output signal (dynamic range A) shown in solid line (a) in FIG. 5 may be generated at the second output terminal 25. It is to be noted that one dot chain line (b) in FIG. 5 is an output signal (dynamic range (B)) when the gain control amplification circuit 21 is not controlled.

FIG. 3 shows a concrete circuit example of FIG. 1. The IF signal obtained from the mixer circuit 17 is amplified by concatenatedly connected first through third transistors 26 through 28 and is applied upon the base of the fourth transistor 29. The fourth transistor 29, together with the fifth transistor 30 differentially connected with the fourth transistor 29, and a first current mirror circuit 31 with the collector current of the fourth transistor 29 being an input, constitutes a level detection circuit 22. An output signal showing an electric field strength is obtained at the output terminal 33 through smoothing of the output current of the first current mirror circuit 31 by a capacitor 32. When the electric field strength of the received signal is small, and the level of the input signal to be applied upon the input terminal 34 is small, the output signal to be obtained at the output terminal 33 becomes small so as to drop the base voltage of a sixth transistor 35 which constitutes the control signal generating circuit 23. The emitter voltage of a seventh transistor 36 connected with the sixth transistor 35 by Darlington connection drops, so that the potential difference between the positive power supply (+B) and the emitter of the seventh transistor 36 becomes large, thus resulting in sufficiently large collector current of the seventh transistor 36. The collector current of the seventh transistor 36 is inverted by a second current mirror circuit 42 composed of an eighth transistor 40 and a ninth transistor 41. The collector current of the ninth transistor 41 is further inversed by a third current mirror circuit 45 composed of tenth and eleventh transistors 43 and 44, the collector current of the eleventh transistor 44 becomes an output control signal of a control signal generating circuit 23. When the input signal to be applied upon the input terminal 34 is small as described hereinabove, the control signal becomes large, so that the operating current of a twelfth transistor 46 diode-connected becomes large and the operating currents of the first through third transistors 26 through 28 connected in current mirror relation with the twelfth transistor 46 also becomes large. The gains of the first through third transistors 26 through 28 are determined by the emitter resistors re and the ratios of the load resistors 47 through 49, and the emitter resistors re are determined in accordance with the operating current 6. When the operating current of the first through third transistors 26 through 28 become large, the emitter resistors re become small, thus resulting in large gains.

Accordingly, when the input signal to be applied upon the input terminal 34 is small, the gain of the gain control amplification circuit 23 becomes large.

As the level of the input signal increases, the level of the output signal also increases. The base voltage of the sixth transistor 35 also increases, the current flowing to the sixth and seventh transistors 35 and 36, and the second and third current mirror circuits 42 and 45 decreases, and the gains of the first through third transistors 26 through 28 reduce correspondingly. Accordingly, the gain of the gain control amplification circuit 21 becomes maximum when the input signal is small, reduces as the input signal increases, so that the output signal shown in the solid line (a) of FIG. 5 is obtained at the output terminal 33.

In the embodiment of FIG. 1, a case where the output signal of the mixer circuit 17 is directly applied upon the gain control amplification circuit 23 has been described, and the IF signal not subjected to the amplitude limit in the IF amplification circuit 19 may be applied upon the gain control amplification circuit 23.

As is clear from the foregoing description, according to the arrangement of the present invention, the enlargement of the dynamic range of the signal showing the electric field strength may be effected, and also the linearity may be improved. Accordingly, the electric field strength of the received signal may be correctly displayed by a display, etc. Especially, as the gain control is effected through the control of the operation current of the gain control amplification circuit in accordance with the gain control signal by the differential type of level detection circuit, an FM receiver suitable for IC may be provided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A circuit arrangement for indicating an electric field strength of a high frequency FM signal received in an FM receiver that has means for receiving the high frequency FM signal and for providing an intermediate frequency (IF) signal, multistage IF limiting amplification circuit means responsive to said receiving and providing means for amplitude limit amplifying of said IF signal so as to produce output signals which are limited in amplitude, and means responsive to said multistage IF limiting amplification circuit means for detecting said output signals, the circuit arrangement comprising:
   amplifying means for amplifying said IF signal to produce an amplified output signal, said amplifying means being connected to a signal path between said receiving and providing means and said multistage IF limiting amplification circuit means so that said IF signal being amplified by said amplifying means is free from being limited in amplitude by said multistage IF limiting amplification circuit means;
   level detecting means responsive to said amplifying means for level detecting said amplified output signal to produce a level detected output signal; and
   generating means for generating a control signal in accordance with said level detected output signal, said amplifying means having a gain and being responsive to said generating means so that said gain varies in accordance with said control signal and so that as an electric field strength of the high frequency FM signal received increases, said gain decreases so as to thereby enlarge a dynamic range for indicating said electric field strength of the high frequency FM signal received.

2. A circuit arrangement as in claim 1, wherein said generating means generates said control signal for reducing said gain of said amplifying means as said electric field strength of the high frequency FM signal received increases.

3. A circuit arrangement as in claim 1, wherein said level detecting means includes first and second transistors each having an emitter and collector, means for connecting each of said emitters to each other, current mirror circuit means for producing output current, means for connecting each of said collectors to said current mirror circuit means, and means for smoothing said output current from said current mirror circuit means so as to generate signals indicative of said electric field strength.

4. A circuit arrangement as in claim 1, wherein said amplifying means is responsive to said control signal such that said gain varies in response to a variance in said electric field strength.

5. A circuit arrangement for indicating electric field strength, comprising:
   gain control amplification means for amplifying output signals;
   level detection means for level detecting the output signals, said level detection means comprising first and second transistors differentially connected to each other and each having one collector generating collector current, and current mirror circuit means for producing output current and receiving said collector current from said one collector of said first and second transistors as input; and
   means for smoothing said output current so as to produce output signals indicative of electric field strength.

6. A circuit arrangement as in claim 5, further comprising:
   means for controlling gain in accordance with said output signals indicative of electric field strength.

* * * * *